(12) United States Patent
Snow et al.

(10) Patent No.: US 7,231,081 B2
(45) Date of Patent: Jun. 12, 2007

(54) STEREOSCOPIC THREE-DIMENSIONAL METROLOGY SYSTEM AND METHOD

(75) Inventors: Donald B. Snow, Mercer Island, WA (US); Raymond H. Kraft, Seattle, WA (US); John T. Strom, North Bend, WA (US)

(73) Assignee: Applied Precision, LLC, Issaquah, WA (US)

( * ) Notice: Subject to any disclaimer, the term of this patent is extended or adjusted under 35 U.S.C. 154(b) by 662 days.

(21) Appl. No.: 10/323,720

(22) Filed: Dec. 18, 2002

(65) Prior Publication Data

US 2003/0142862 A1     Jul. 31, 2003

Related U.S. Application Data

(60) Provisional application No. 60/346,447, filed on Dec. 28, 2001.

(51) Int. Cl.
*G06K 9/00* (2006.01)
(52) U.S. Cl. ............... 382/151; 382/141; 382/154; 382/287; 356/401
(58) Field of Classification Search ........... 382/151, 382/154
See application file for complete search history.

(56) References Cited

U.S. PATENT DOCUMENTS

| 5,537,204 | A | * | 7/1996 | Woodhouse | 356/243.1 |
| 6,064,756 | A | * | 5/2000 | Beaty et al. | 382/146 |
| 6,134,975 | A | * | 10/2000 | Keil | 73/865.8 |
| 6,377,701 | B1 | * | 4/2002 | Ohki | 382/154 |

* cited by examiner

*Primary Examiner*—Bhavesh M Mehta
*Assistant Examiner*—John B. Strege
(74) *Attorney, Agent, or Firm*—Pillsbury Winthrop Shaw Pittman LLP

(57) ABSTRACT

A stereoscopic three-dimensional optical metrology system and method accurately measure the location of physical features on a test article in a manner that is fast and robust to surface contour discontinuities. Disclosed embodiments may image a test article from two or more perspectives through a substantially transparent fiducial plate bearing a fiducial marking; camera viewing angles and apparent relative distances between a feature on a test article and one or more fiducials may enable accurate calculation of feature position.

35 Claims, 6 Drawing Sheets

STEREOSCOPIC THREE-DIMENSIONAL METROLOGY SYSTEM AND METHOD

This application claims the benefit of U.S. provisional application Ser. No. 60/346,447 entitled "APPARATUS FOR STEREOSCOPIC THREE-DIMENSIONAL METROLOGY," filed Dec. 28, 2001.

FIELD OF THE INVENTION

Aspects of the present invention relate generally to metrology, and more particularly to a system and method of accurately measuring the three-dimensional location of physical features on a test article in a manner that is fast and robust to surface contour discontinuities.

DESCRIPTION OF THE RELATED ART

Several three-dimensional (3D) optical metrology techniques are generally known and currently practiced. These methods include structured lighting, moire and laser interferometry, laser range finding, and a conventional two camera approach. Each of the conventional methods suffers from significant deficiencies at least with respect to measurement applications: requiring high speed and parallelized information acquisition; in which surface contours may include steep sloping surfaces or surface discontinuities; and in which it is desirable to avoid expensive, high accuracy motion stages. The structured lighting and interferometric methods, for example, provide poor results with respect to measuring features on a test article having steeply sloping surfaces or surface discontinuities. The laser range finding method is slow and generally inaccurate. The traditional two camera approach relies upon stage accuracy.

Laser interferometry systems direct a focused laser beam onto a test article and interfere the sensed reflected beam with a reference beam. Fringe pattern shifts are counted to infer variations in distance from the laser source. These systems and methods can be highly precise, but are generally limited in at least the following respects. Continuity between images is essential in order that such systems may maintain an accurate reference. Accordingly, laser interferometric techniques do not permit omission of uninteresting regions of the test article; this slows performance. Further, steeply pitched surfaces or surface discontinuities (e.g., sharp vertical edges or one object disposed on top of another) can result in erroneous data.

Moire interferometry systems and methods project a reference grid from a particular direction onto a test article while viewing the test article from another direction; distances can be inferred from observed variations in spacing between grid lines caused by sloping surfaces. This is a relatively fast imaging strategy that can capture an entire displacement field from a single measurement. Similar to laser interferometry, however, steeply pitched surfaces and surface discontinuities can result in erroneous data.

Laser range finding methodologies direct a focused laser beam onto a test article and employ time-of-flight measurements to compute distance. The beam must be tightly focused when measuring distances to small, densely packed objects such as features on a semiconductor wafer, for example. Accordingly, laser range finding is a relatively slow process, as it is generally limited to capturing only a single measurement for each beam location. Further, this method does not provide sufficient resolution to ensure accurate measurements at the sub-micron level.

Structured lighting methods project precise bands of light onto a test article. Deviations in light band line straightness, when viewed obliquely, are translated into depth information. This method suffers from the following limitations: similar to the interferometric techniques, steeply pitched surfaces and surface discontinuities can result in erroneous measurement data; and specular reflections from the highly focused bands of light can also lead to erroneous data.

The traditional two camera system acquires images using a first camera positioned, for example, directly above the test article to obtain lateral measurements (i.e., x and y coordinates); a second camera, imaging from a different perspective or optical axis, is used to triangulate feature height (i.e., z dimension). This approach is generally limited by the precision with which the stage supporting the test article can be moved. Stage inaccuracies translate directly into measurement error; accordingly, extremely precise stage motion is required for this approach, particularly in cases where the features on the test article are small and closely packed.

SUMMARY

Embodiments of the present invention overcome the above-mentioned and various other shortcomings of conventional technology, providing a stereoscopic three-dimensional optical metrology system and method of accurately measuring the location of physical features on a test article in a manner that is fast and robust to surface contour discontinuities. As set forth in detail below, a system and method of three-dimensional optical metrology may image a test article from two or more perspectives through a substantially transparent fiducial plate bearing a fiducial marking. Camera viewing angles and apparent relative distances between a feature on a test article and one or more fiducials may enable accurate calculation of feature position.

In accordance with one embodiment, for example, a method of measuring a location of a physical feature on a test article comprises: supporting a test article to be imaged; interposing a fiducial plate bearing a fiducial between the test article and an imaging device; imaging a feature of the test article and the fiducial; and measuring a location of the feature relative to the fiducial.

The foregoing supporting may comprise utilizing a stage movable along any of three coordinate axes; additionally or alternatively, the stage may be rotatable about any of the three axes. As set forth in detail below, imaging may comprise selectively orienting the stage relative to the imaging device, or selectively orienting the imaging device relative to the stage.

In particular, imaging may comprise selectively translating an image plane of the imaging device relative to the test article; in that regard, selectively translating an image plane may comprise moving the imaging device relative to the test article or moving the test article relative to the imaging device.

In some embodiments, the imaging may comprise acquiring first image data from a first perspective and second image data from a second perspective; it will be appreciated that the acquiring may comprise obtaining the first image data on a first image plane oriented at a first angle relative to the article and obtaining the second image data on a second image plane oriented at a second angle relative to the article. The first angle and the second angle may be equal.

In accordance with one exemplary implementation of the foregoing embodiment, the acquiring comprises: obtaining the first image data when the imaging device is at a first location relative to the article; selectively adjusting the relative positions of the imaging device and the article; and obtaining the second image data when the imaging device is at a second location relative to the article.

In accordance with some exemplary methods, measuring a location of the feature relative to the fiducial comprises computing an apparent distance between the feature and the fiducial. Selectively repeating the imaging and the measuring may improve the accuracy of a positional measurement.

In one embodiment, for example, the fiducial plate bears a plurality of fiducials and the measuring comprises computing apparent distances between the feature and selected ones of the plurality of fiducials.

In accordance with one disclosed embodiment, a metrology system comprises: a stage operative to support an article to be imaged; an imaging device selectively oriented relative to the stage and operative to acquire image data on an image plane; and a fiducial plate, bearing a fiducial, interposed between the article to be imaged and the imaging device. The imaging device may be operative to image the fiducial and a feature on the article.

The system may further comprise an image processing component operative to compute an apparent distance between the feature and the fiducial from the image data.

At least one of the stage and the imaging device may be movable along any of three coordinate axes and may additionally or alternatively be rotatable about any of the three axes. In some such embodiments, the system may further comprise a control element operative selectively to control relative movement of the stage and the imaging device.

In some exemplary embodiments, the imaging device comprises a charge-coupled device image sensor, a complementary metal oxide semiconductor image sensor, or a similar image sensor device.

The system may be implemented wherein the fiducial plate bears a plurality of fiducial markings. In such a system, the image processing component may be operative to compute apparent distances between the feature and selected ones of the plurality of fiducial markings.

In accordance with some embodiments, the imaging device acquires first image data from a first perspective relative to the article and second image data from a second perspective relative to the article. The first image data may be obtained when the image plane is oriented at a first angle relative to the article and the second image data may be obtained when the image plane is oriented at a second angle relative to the article. As noted above, the first angle and the second angle are equal in some implementations.

In one exemplary arrangement of the system: the first image data are acquired when the imaging device is at a first location relative to the article; the relative positions of the imaging device and the article are selectively adjusted; and the second image data are acquired when the imaging device is at a second location relative to the article.

As set forth in detail below, the article may comprise a semiconductor wafer, chip, or die, for example.

The foregoing and other aspects of various embodiments of the present invention will be apparent through examination of the following detailed description thereof in conjunction with the accompanying drawings.

DETAILED DESCRIPTION

Figure 1A:
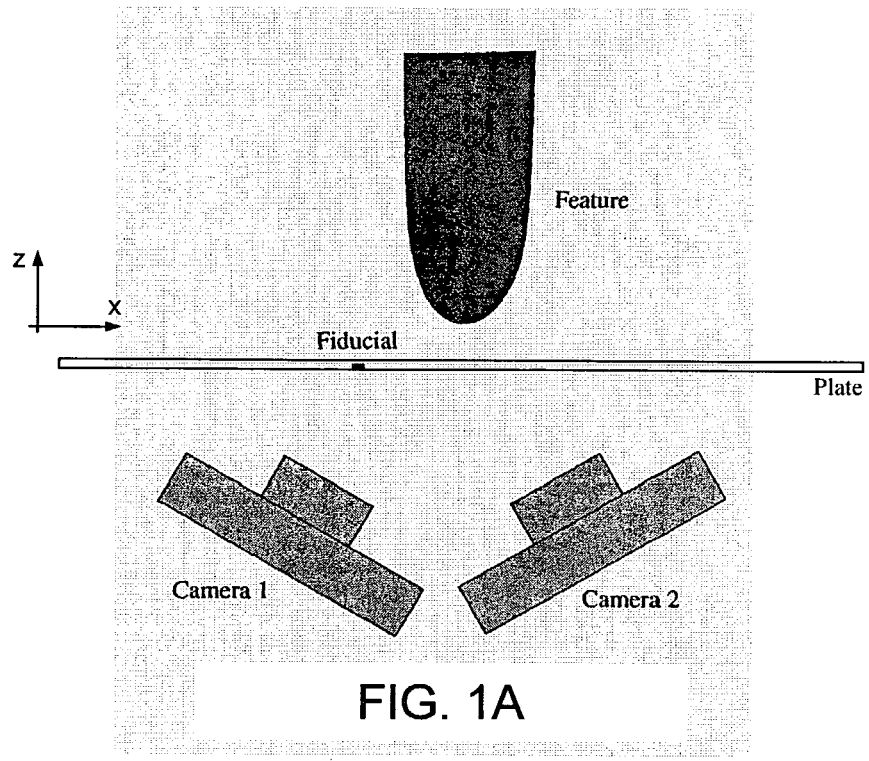
FIGS. 1A and 1B are simplified functional block diagrams illustrating one embodiment of a stereoscopic three-dimensional metrology system.

As set forth in detail below, aspects of the present system and method may minimize or eliminate the foregoing significant deficiencies of conventional metrology approaches, specifically: (1) speed or throughput rate limitations; (2) measurement difficulties associated with surface discontinuities; and (3) reliance upon the accurate motion of stages.

The exemplary embodiments acquire field measurements, not point measurements. In particular, each imaged field of view may produce position measurements for every identified feature in a view, and accordingly, a high degree of parallelism may be achieved. As a consequence, position measurement throughput is significantly greater than can be attained using point measurement methods such as laser range finding. Further, unlike the interferometric strategies and the structured light approach, a system and method operative in accordance with the present disclosure do not require image location continuity to ensure a tie to an established reference. Position measurements may be taken for any sampling of positions on the test article without the need to gather data on intermediate locations.

Interferometric methods yield position measurements relative to previous measurements. In order to measure the position of a particular point on a test article, therefore, interferometer systems must accumulate distance variations from point to point, moving from a reference point to the final point of interest. Any disturbance, anomaly, error, or other variation in this accumulation caused by surface discontinuities will produce errors in all downstream (i.e., subsequent) measurements. The system and method set forth herein, however, yield position measurements relative to an established reference point, i.e., one or more fiducial marks. Accumulation of distance variations is not necessary. Aside from possible occlusion of areas of interest, steeply pitched or discontinuous surfaces do not prevent accurate measurements.

Further, a stereoscopic optical metrology system constructed and operative in accordance with the present disclosure eliminates the need for highly accurate stages; the burden of accuracy may be shifted to the fiducials and the imaging system. Manufacturing a fiducial plate to given accuracy tolerances is significantly easier (and consequently, substantially less costly) than manufacturing a stage (and the attendant actuators, control mechanisms, and other hardware) to perform accurately within those tolerances.

Although one particular application for the exemplary embodiments is the measurement of semiconductor industry probe card planarity and alignment, those of skill in the art will readily appreciate that the utility of the present system and method is equally applicable in other arenas.

Turning now to the drawing figures, it is noted that FIGS. 1A–B and 2A–B are simplified functional block diagrams illustrating respective embodiments of a stereoscopic three-dimensional metrology system. The underlying principle of operation involves measuring the two Cartesian components of distance between a feature of interest and a fiducial from two different perspectives. Due to parallax, the distance between the feature and the fiducial, when observed from each of the two perspectives, will be measurably different. Given these two apparent distances and the relative positions of the two different perspective views, it is possible to calculate the true location, in three-dimensional (3D) space, of a feature relative to a fiducial.

Figure 1B:
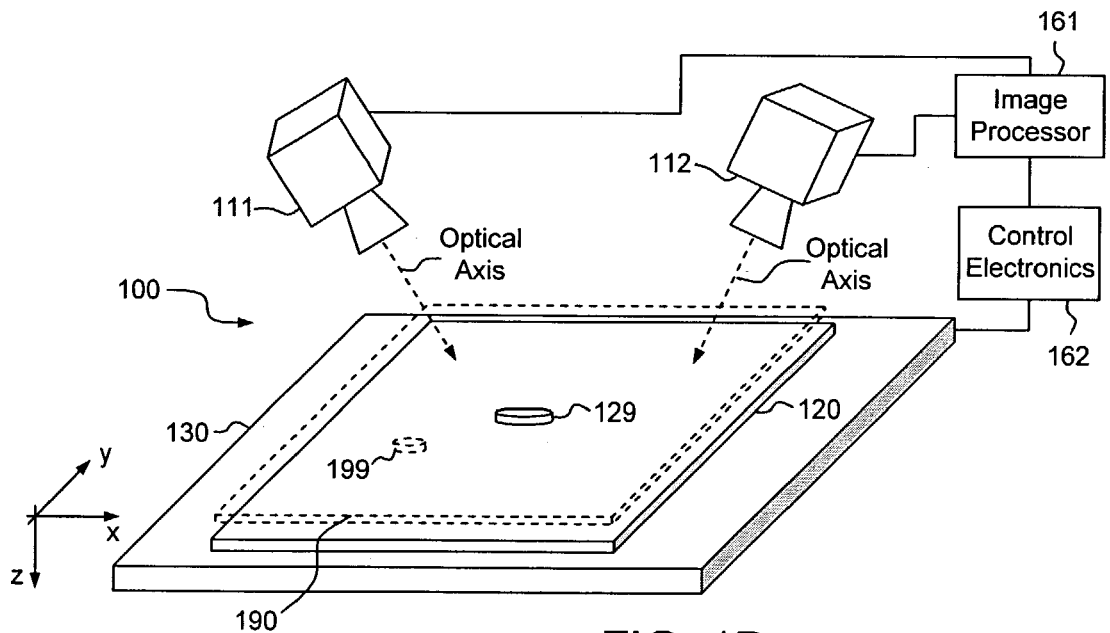

As illustrated in FIGS. 1A and 1B, one way to gather two perspective images is to use two cameras or imaging devices 111 and 112 separated by some distance; each imaging device may be configured and oriented to observe and to image the same scene. In that regard, FIGS. 1A and 1B depict a fiducial object 199, a feature 129 (the location of which is to be calculated), and two angular perspectives from which imaging devices 111, 112 may view these objects.

Figure 2A:
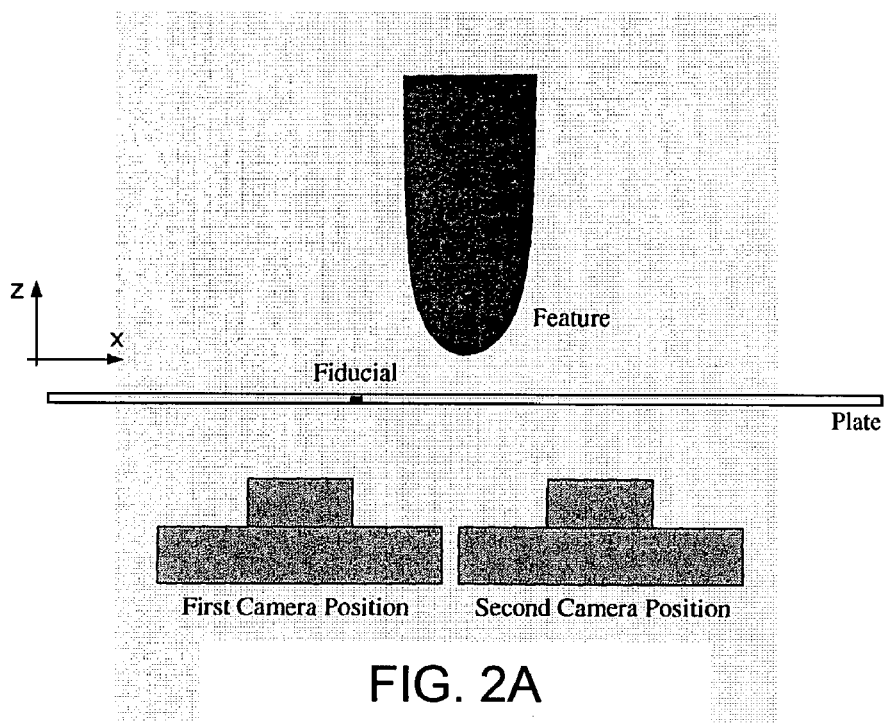
FIGS. 2A and 2B are simplified functional block diagrams illustrating another embodiment of a stereoscopic three-dimensional metrology system.
Figure 2B:
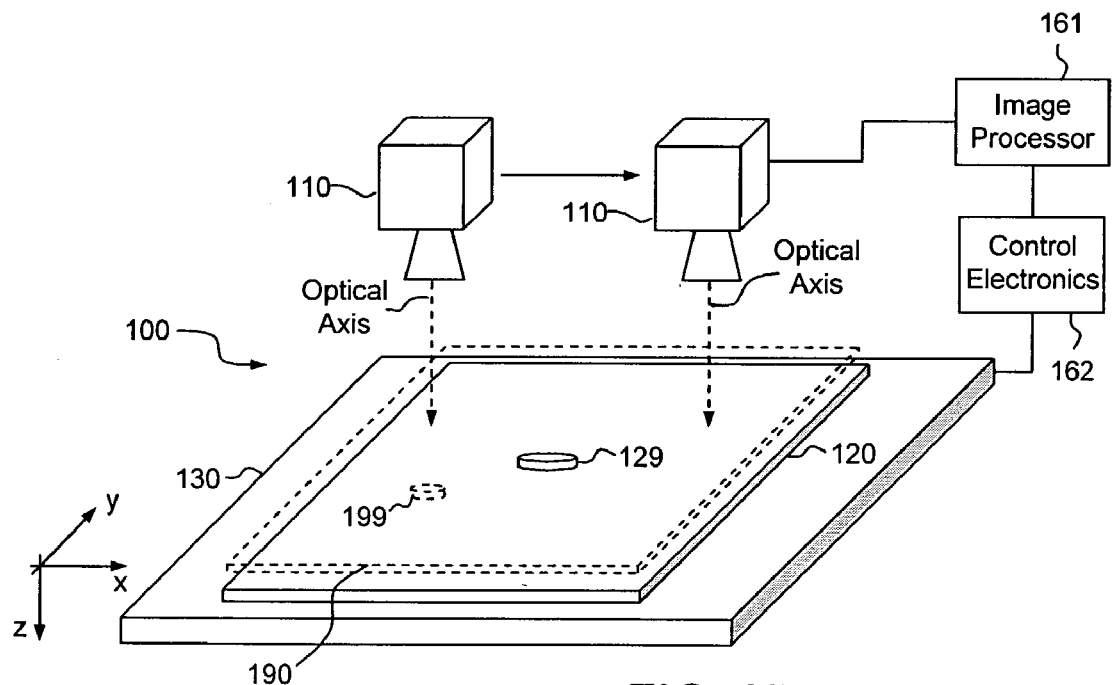

As illustrated in FIGS. 2A and 2B, another approach to gathering two perspective images is to use a single imaging device 110 that may scan along a particular direction (e.g., the x direction in FIG. 2B) relative to the article 120 to be imaged. Imaging device 110 may capture images of the same feature 129 and fiducial 199 at different points or locations during the scan. The changing apparent distance between feature 129 and fiducial 199 from one side of the field of view to the other may be used, in the same manner as the approach depicted in FIGS. 1A and 1B, to calculate a position of feature 129.

In the exemplary embodiments, system 100 generally comprises an imaging device 310, or a pair of imaging devices 111, 112, operative to acquire image data of a 3D object space, in general, and of a test article 120, in particular. An object or feature 129 of interest to be imaged may be supported or disposed on test article 120; in some embodiments, for example, test article 120 may be embodied in or comprise a microscope slide, a microarray, a microtiter or other multi-well plate, a semiconductor chip, die, or wafer, or any other similar structure configured and operative to support objects, specimens, sample material, features, and the like for viewing or imaging.

Test article 120 may be fixedly or movably attached to, or otherwise disposed on, a precision motion stage 130 or other movable support element, and may be moved or translated through precise motion of stage 130. In that regard, test article 120 may be movable in any or all of the x, y, and z directions, as is generally known in the art; this movement may be accomplished through translation of test article 120 itself (i.e., relative to stage 130), through motion of stage 130 or any other apparatus upon which test article 120 is disposed, or both. Accordingly, selective translation of test article 120 along one or more coordinate axes may allow article 120 and feature 129 to be selectively positioned at a suitable location (relative to imaging devices 110 or 111, 112) for imaging. Additionally or alternatively, test article 120, stage 130, or both may be rotatable about one or more coordinate axes.

Numerous and varied apparatus and methods of providing controlled movement or translation of test article 120 and stage 130 are known and well within the capabilities of an ordinarily skilled artisan. The scope of the present disclosure is not intended to be limited by any structures and techniques employed to manipulate or to orient test article 120. As an alternative, for example, since the functionality and accuracy of the exemplary embodiments are not dependent upon accurate motion of stage 130 as set forth above, it will be appreciated that stage 130 and test article 120 may be fixed relative to the x, y, and z axes. In such alternative embodiments, any relative movement necessary to provide different imaging perspectives may be effectuated through selective movement of imaging devices 110 or 111,112 relative to one or more coordinate axes.

In some implementations, imaging devices 110–112 may be embodied in or comprise a camera incorporating charge-coupled device (CCD) technology, for example, or complementary metal oxide semiconductor (CMOS) image sensors. Additionally or alternatively, imaging devices 110–112 may comprise supplementary optical elements or imaging components such as lens arrays or serial focusing elements, optical microscopes, scanning electron microscopes (SEM), spectrophotometers, or any other apparatus or instrument configured and operative in conjunction with image sensors or sensor arrays to acquire video or image data.

Imaging devices 110–112 may additionally comprise or be coupled to one or more image processing components (such as image processor 161) operative to process, store, or otherwise to manipulate captured image data as desired. Such image processing components may comprise one or more microprocessors or microcontrollers, for example, capable of executing software code or other instruction sets for interpolating, extrapolating, filtering, deconvolving, or otherwise manipulating image data captured by and transmitted from devices 110–112. Image processor 161 may execute or run a real-time operating system, for example, enabling reconfiguration or selective programming of processor functionality. In particular, it is noted that image processor 161, either independently or in conjunction with one or more additional image processing components, may be employed to perform the computations and operations set forth in detail below.

As is generally known in the art, some image processing techniques are processor intensive (i.e., computationally expensive) and require significant computing power and other resources for data manipulation and storage. Accordingly, image processor 161 may additionally comprise computer readable storage media such as: read-only memory (ROM); random access memory (RAM); hard or floppy disk drives; digital versatile disk (DVD) drives; or other magnetic, optical, or magneto-optical computer storage media and attendant hardware. Sufficient storage media may be provided to support the computational functionality described in detail below with reference to FIGS. 3–5, as well as to enable reconfiguration or selective programming as noted above.

In a manner similar to that of test article 120 and stage 130, imaging devices 110–112 may be movable in any or all of the x, y, and z directions; accordingly, selective movement or translation of devices 110 and 111,112, or of one or more components thereof, along one or more coordinate axes may enable precise positioning of a focal plane with respect to test article 120. Various apparatus and methods of providing controlled movement of devices 110–112 or providing accurate placement of focal planes are generally known in the art. In that regard, devices 110–112 may be operably coupled to guide rails or tracks, stepper motors, articulated arms, or other automated structures or robotic systems operative selectively to position devices 110–112 relative to test article 120 for imaging operations.

Additionally, device 110 and in particular, devices 111 and 112, or one or more components thereof, may be rotatable about one or more of the x, y, and z coordinate axes. In that regard, devices 110–112 may be operably coupled to or mounted on appropriate hardware such as hinges, gimbals, journal and bearing assemblies, or other pivotable structures capable of selectively orienting, supporting, and maintaining devices 110–112 at a predetermined or dynamically adjustable angle relative to one or more coordinate axes. In some embodiments, selective or dynamic rotation of devices 110–112 about one or more axes may not be necessary; in such embodiments, devices 110–112 may be fixed at a particular angular orientation to support the functionality set forth below.

The scope of the present disclosure is not intended to be limited by any structures and techniques employed to manipulate devices 110–112. It will be appreciated that relative motion between devices 110–112 and stage 130 in general, and test article 120 in particular, may be implemented or controlled in numerous ways.

In that regard, system 100 may further comprise one or more microprocessors, microcontrollers, or other electronic devices (such as control electronics 162) operative to control relative movement, positioning, and orientation of devices 110 or 111,112 and test article 120. As indicated in FIGS. 1B and 2B, control electronics 162 may be operably coupled to image processor 161 described above or to other image processing components. In some embodiments, image processor 161 may initiate, execute, or terminate scanning or image capture operations, for example, responsive to control signals or other data (e.g., indicative of placement or relative movement of devices 110 or 111,112 and test article 120) received from control electronics 162. Similarly, control electronics 162 may receive data or instructions sets (e.g., relating to desired movements or the timing thereof) from image processor 161, and may arrange or orient devices 110 or 111,112 and test article 120 accordingly. It will be appreciated that the functionality of image processor 161 and control electronics 162 may be combined, incorporated, or integrated into a single device or hardware arrangement.

In the embodiments depicted in FIGS. 1A–B and 2A–B, system 100 further comprises a fiducial plate 190 disposed, supported, or otherwise maintained between devices 110 or 111,112 and test article 120. Plate 190 may be operative to carry or to display one or more markings or reference indicia, such as fiducial 199, which may be arranged randomly, for example, or in an ordered array or predetermined orientation. Only one fiducial 199 is illustrated in the drawing figures for clarity; it is noted, however, that the illustrations are not intended to be interpreted in any limiting sense.

Fiducial plate 190 may be constructed or fabricated to be substantially transparent, enabling imaging of article 120, feature 129, and fiducial 199 while plate 190 is interposed between article 120 and imaging devices 110 or 111,112. Such transparency may be facilitated or influenced by, for example, the properties of the material or composition used to construct plate 190, the thickness, polish, planarity, and other surface characteristics of plate 190, and so forth. In this context, therefore, the term "substantially transparent" generally refers to a fiducial plate 190 constructed of suitable materials and having appropriate dimensional characteristics such that plate 190 neither prohibits optical or other imaging of article 120 therethrough nor otherwise interferes with the functionality and operation of imaging devices 110–112 as set forth herein.

In some implementations, plate 190 may be embodied in or comprise glass, quartz, acrylic, sapphire, silica, or any other material known to have appropriate material properties to support the imaging functionality of imaging devices 110–112 and system 100. Fiducial 199 or a fiducial array as described above may be etched onto a surface, supported or suspended within, or otherwise incorporated into plate 190.

When interposed between imaging devices 110 or 111,112 and test article 120, plate 190 may be supported or otherwise fixed at a known location or orientation relative to the 3D coordinate axis system (e.g., the origin in FIGS. 1B and 2B, where x=0, y=0, z=0). Accordingly, the location of fiducial 199 or other reference indicia in 3D space may be accurately computed and subsequently employed to calculate a location for feature 129 with respect to the coordinate axis system, in general, and with respect to other features or reference points on test article 120, in particular.

In that regard, fiducial 199 may be so dimensioned or constructed to enable selective imaging thereof. In some embodiments, for example, fiducial 199 may be configured or fabricated to be substantially transparent during operations employing a particular imaging modality. For instance, fiducial 199 (or each of a plurality of fiducials arranged in an array) may be suitably sized or colored only to appear visible or opaque under certain conditions, rending fiducial 199 substantially transparent to incident light of a particular wavelength or frequency band, for example, employed to image feature 129. In such embodiments, providing illumination of a different wavelength or otherwise switching the imaging modality may selectively enable imaging of fiducial 199.

It will be appreciated that both feature 129 and fiducial 199 may still be imaged in these implementations, though fiducial 199 may only be opaque in one of the two selected modalities. In accordance with the foregoing embodiment, feature 129 may be imaged from a particular perspective using a particular modality rendering fiducial 199 transparent, the imaging technique may be altered to employ a second modality, and fiducial 199 may then be imaged from the same perspective (it is noted that feature 129 may also be imaged in the second modality). Image data acquired during the two imaging operations may be combined to provide an accurate representation of both fiducial 199 and feature 129 in a single composite image frame. Accordingly, an apparent distance between fiducial 199 and feature 129 may be obtained as set forth in detail below.

The foregoing dual-modality embodiment may have particular utility in situations where feature sizes are small (e.g., relative to the size of fiducial 199), for example, or where an opaque fiducial 199 may otherwise obscure feature 129 if the two were imaged simultaneously. Fiducial 199 may be specifically colored, textured, shaded, dimensioned, or otherwise manipulated to support the functionality set forth above. It some embodiments, for example, fiducial 199 may be embodied in or comprise one or more liquid crystal elements or fluorescent materials disposed on or incorporated into plate 190; incident light or applied electric or magnetic fields may cause or selectively enable fiducial opacity or transparency. Additionally or alternatively, fiducial 199 may be etched into a surface a plate 190 in such a manner as to create a texture or other surface or structural characteristic enabling substantial transparency under certain circumstances and opacity under other circumstances.

Figure 3:
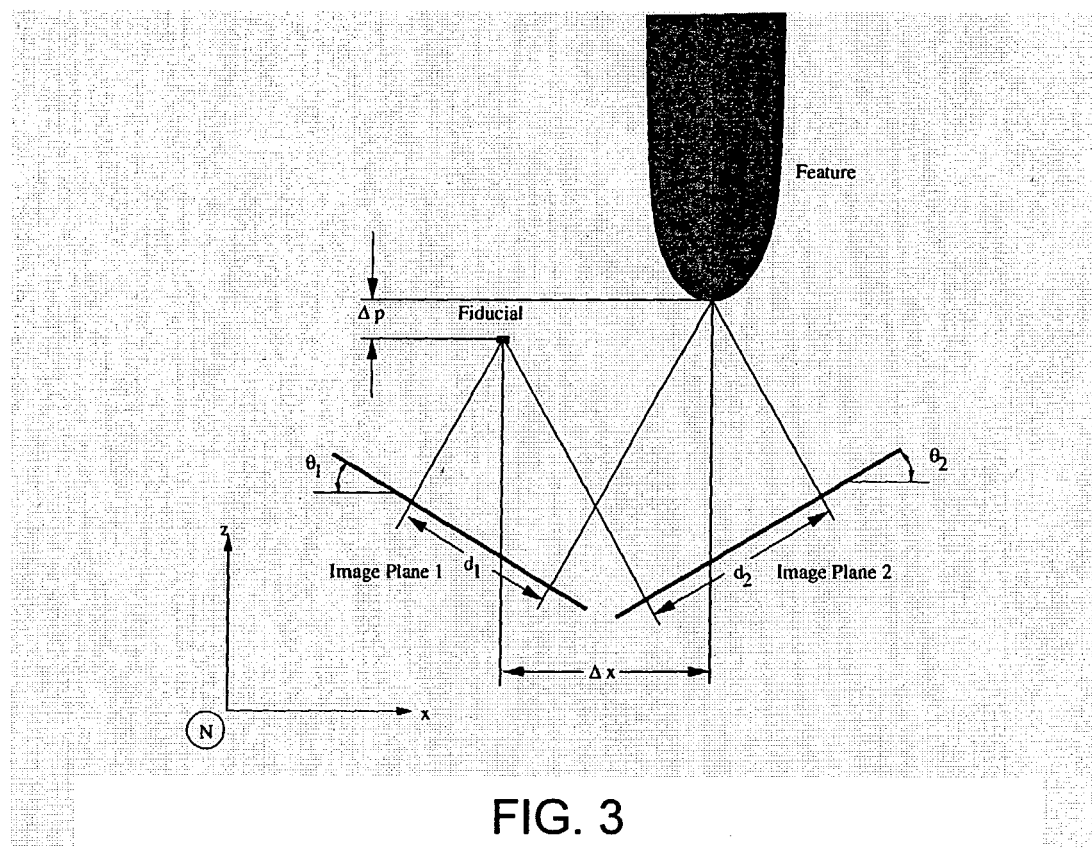
FIG. 3 is simplified diagram illustrating geometric aspects of a metrology system constructed and operative in accordance with the embodiment of FIGS. 1A and 1B.

FIG. 3 is simplified diagram illustrating geometric aspects of a metrology system constructed and operative in accordance with the embodiment of FIGS. 1A and 1B. The exemplary FIG. 3 geometry may be used to calculate 3D feature locations from the mathematical relationship between apparent feature-fiducial distances. The two cameras or imaging devices 111, 112 are simply represented by their imaging planes, identified as Image Plane 1 and Image Plane 2, respectively. As set forth above, these image planes may comprise or be characterized by CCD or CMOS image sensors, for example, or some other image sensor technology.

A 3D coordinate system, N, may be defined by a set of mutually perpendicular unit vectors x, y, and z, where the y axis is normal to the plane of FIG. 3. The imaging plane of the first imaging device 111 (Image Plane 1) may be selectively rotated by an angle, $\theta_1$, about the y axis, and the imaging plane of the second imaging device 112 (Image Plane 2) may be selectively rotated by an angle, $\theta_2$, about the y axis. Fiducial 199 and the "tip" of feature 129 may be normally projected onto each respective imaging plane, producing respective apparent distances $d_1$ and $d_2$.

Given the apparent distances $d_1$ and $d_2$, the position of the feature's tip relative to the fiducial may be described by the distances $\Delta x$, $\Delta y$, and $\Delta p$, where "p" represents "planarity," or distance in the z direction. Since both imaging planes are rotated about the y axis, position components on this vector are generally not affected by rotations $\theta_1$ and $\theta_2$. Consequently, the $\Delta y$ component of the feature's position relative to the fiducial may be directly observed on both imaging planes. The components $\Delta x$ and $\Delta p$ may be calculated via equations (1) and (2) as follows.

$$\Delta p = \frac{d_1 \cos(\theta_2) - d_2 \cos(\theta_1)}{\sin(\theta_1 + \theta_2)} \quad (1)$$

$$\Delta x = \left\{ \frac{d_1 \cos(\theta_2) - d_2 \cos(\theta_1)}{\sin(\theta_1 + \theta_2)} \right\} \tan(\theta_2) + \frac{d_2}{\cos(\theta_2)} \quad (2)$$

$$= \Delta p \tan(\theta_2) + \frac{d_2}{\cos(\theta_2)}$$

If both angles, $\theta_1$ and $\theta_2$, are equal (i.e., $\theta_1 = \theta_2 = \theta$), then equations (1) and (2) simplify as follows:

$$\Delta p = \frac{(d_1 - d_2)}{2\sin\theta} \quad (3)$$

$$\Delta x = \frac{(d_1 - d_2)}{2\cos\theta} + \frac{d_2}{\cos\theta} \quad (4)$$

Figure 4:
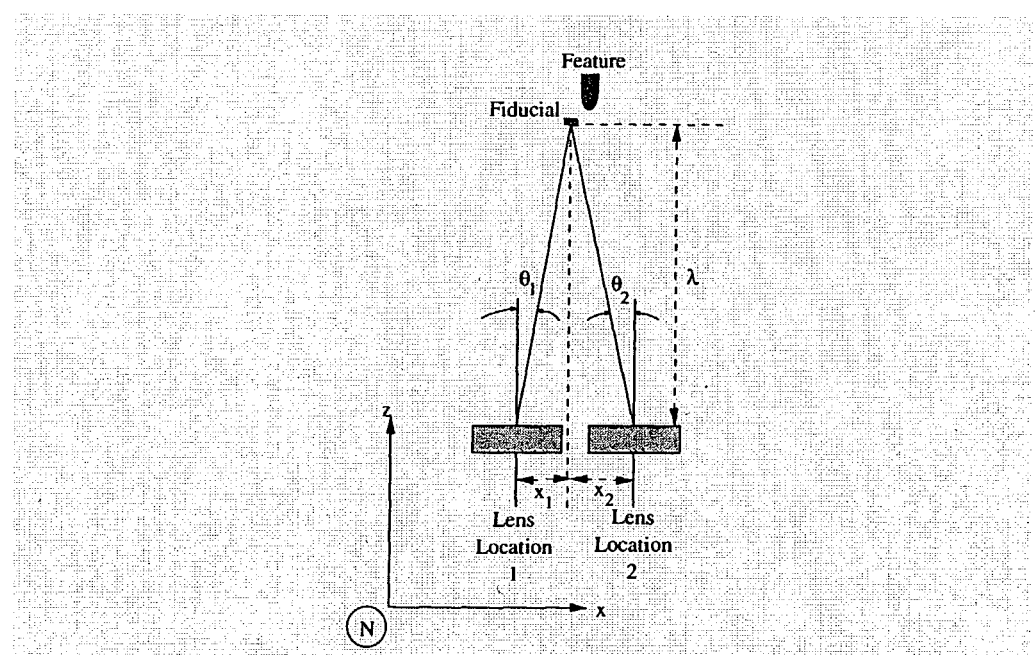
FIG. 4 is simplified diagram illustrating geometric aspects of a metrology system constructed and operative in accordance with the embodiment of FIGS. 2A and 2B.

FIG. 4 is simplified diagram illustrating geometric aspects of a metrology system constructed and operative in accordance with the embodiment of FIGS. 2A and 2B. In this instance, the angle $\theta_1$ may be defined as the angle between the lens centerline and the fiducial when the lens is at "Lens Location 1" and the image is at one extreme of the field of view. Similarly, the angle $\theta_2$ may be defined as the angle between the lens centerline and the fiducial when the lens is at "Lens Location 2" and the image is at the other extreme of the field of view.

Generally, calculating the angles depicted in FIG. 4 requires accurate knowledge of the location of the stage (reference numeral 130 in FIG. 2B) and consequently, the location of the test article (reference numeral 120 in FIG. 2B) supported thereon. Requiring knowledge of stage location is substantially different than requiring accurate motion of the stage, i.e. ascertaining the location of the stage in 3D space is significantly easier than precisely controlling the motion of the stage through that space.

In that regard, an inexpensive but highly accurate fiducial plate 190 may facilitate accurate determination of stage location. Accordingly, precise measurements of the lateral offset of the fiducial from the lens centerline in the x direction (distances $x_1$ and $x_2$ in FIG. 4) may be obtained. Knowledge of the approximate distance from the lens to the fiducial ($\lambda$ in FIG. 4) may also facilitate computation of the feature's position in 3D space. Given the foregoing variables, the angles $\theta_1$ and $\theta_2$ may then be calculated as follows.

$$\theta_1 = \tan^{-1}\left(\frac{x_1}{\lambda}\right) \approx \frac{x_1}{\lambda} \quad (5)$$

$$\theta_2 = \tan^{-1}\left(\frac{x_2}{\lambda}\right) \approx \frac{x_2}{\lambda}. \quad (6)$$

Analysis of the sensitivity of $\theta_1$ and $\theta_2$ to $\lambda$ in equations (5) and (6) reveals that for small angular values, $\theta_1$ and $\theta_2$ are generally insensitive to variations or errors in $\lambda$. Given the computed values for angles $\theta_1$ and $\theta_2$ and the apparent feature to fiducial distances (ie., $d_1$ and $d_2$ as illustrated in FIG. 3) at the two lens locations in FIG. 4, the processing required to determine feature location follows the same path as outlined above with specific reference to equations (1) and (2).

Returning now to the embodiment illustrated in FIGS. 1A and 1B where $\theta_1 = \theta_2 = \theta$, variations on equations (3) and (4) may enable characterization of the accuracy of the final position measurement for a given feature. Equations (7) and (8), for example, respectively express the accuracy of the planarity, $\delta(\Delta p)$, and alignment, $\delta(\Delta x)$, measurements as functions of both: variations or errors in the first and second apparent distances, $\delta d_1$ and $\delta d_2$; and variations or perturbations in the image plane angle, $\delta\theta$.

$$\delta(\Delta p) = \frac{1}{2\sin\theta}\delta d_1 - \frac{1}{2\sin\theta}\delta d_2 + \left[\frac{\cos\theta(d_2 - d_1)}{2\sin^2\theta}\right]\delta\theta \quad (7)$$

$$\delta(\Delta x) = \frac{1}{2\cos\theta}\delta d_1 + \frac{1}{2\cos\theta}\delta d_2 + \left[\frac{\sin\theta(d_1 + d_2)}{2\cos^2\theta}\right]\delta\theta \quad (8)$$

Figure 5:
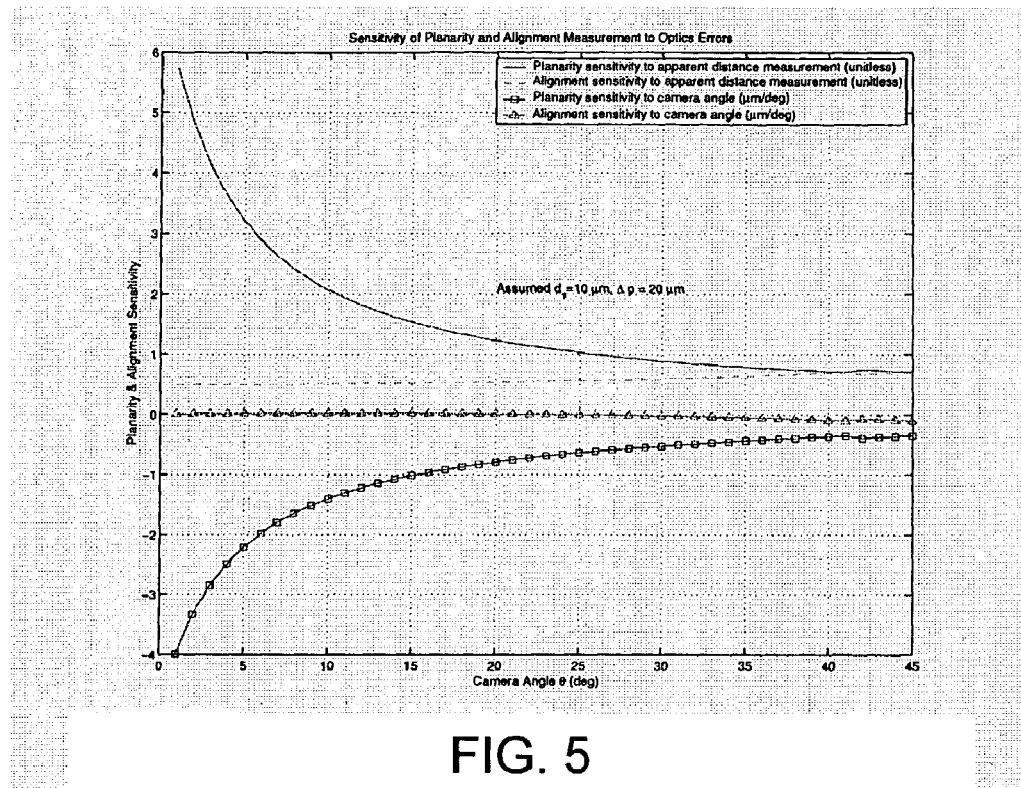
FIG. 5 is a graph representing data for planarity and alignment measurement sensitivities as functions of imaging device viewing angle.

FIG. 5 is a graph representing data for planarity and alignment measurement sensitivities as functions of imaging device viewing angle, $\theta$. As illustrated in FIG. 5, data representing planarity and alignment sensitivities (with respect to both variations in apparent distance measurement as well as variations about nominal camera viewing angle) were generated for imaging device viewing angles of between about 1° and about 45°. The data were generated assuming a nominal apparent distance $d_1 = 10$ µm and a planarity distance $\Delta p = 20$ µm.

As is apparent from examination of the FIG. 5 data, for small, shallow viewing angles, planarity accuracy is greatly affected by errors in the apparent distance measurement as well as by variations or perturbations in the camera angle. At a viewing angle of 2°, for example, every unit of apparent distance error translates into roughly 5 times as great a value for the planarity measurement error. Alignment accuracy, however, is only nominally affected by apparent distance or camera angle errors; in the case of alignment accuracy sensitivity, each unit of apparent distance error translates into only about ½ that amount of planarity measurement error.

With increasing viewing angles, planarity error generally improves and alignment error generally worsens; as indicated in the FIG. 5 graph, the rate at which planarity error improves, however, greatly exceeds the rate at which alignment error worsens.

Given a desired accuracy for planarity and alignment measurements, a known accuracy for apparent distance and camera angle measurements, the data illustrated in FIG. 5, and the relationships set forth in equations (7) and (8), a corresponding desired or optimal image plane angle θ may be calculated for the embodiment illustrated and described in detail above with reference to FIGS. 1A and 1B.

Equations (7) and (8) show that uncertainty in the image plane angle θ may lead to position measurement error; accordingly, determining the image plane angle θ with certainty may facilitate minimization or elimination of such errors. Two approaches may be effective in determining θ with sufficient precision to achieve this goal: (1) precisely construct system 100 and any apparatus supporting imaging devices 111, 112 to such tolerances that the image plane angle θ is known to be within the tolerances established by the manufacturing process; or (2) allow for looser manufacturing tolerances and measure the image plane angle θ to exacting tolerances.

In accordance with some embodiments, for example, image plane angles $\theta_1$ and $\theta_2$ for imaging devices 111 and 112, respectively, may be precisely computed using a very flat fiducial plate 190 containing at least two fiducial marks having a known spacing. Given the apparent distance between the fiducial marks in the two camera views ($d_{f1}$ and $d_{f2}$) and the true distance between the fiducial marks ($\Delta x_{fiducial}$), the image plane angles $\theta_1$ and $\theta_2$ relative to fiducial plate 190 may easily be computed in accordance with equations (9) and (10).

$$\theta_1 = \cos^{-1}\left(\frac{d_{f1}}{\Delta x_{fiducial}}\right) \quad (9)$$

$$\theta_2 = \cos^{-1}\left(\frac{d_{f2}}{\Delta x_{fiducial}}\right) \quad (10)$$

The accuracy of these measured angles is related to the apparent distance measurement accuracy via $$\delta\theta_1 = -\frac{\delta d_{f1}}{\Delta x_{fiducial} \cdot \sin\theta_1}. \quad (11)$$

where $\theta_2$ may be substituted for $\theta_1$ and $d_{f2}$ may be substituted for $d_{f1}$. Due to the sin $\theta_1$ term in the denominator of equation (11), the accuracy of the $\theta_1$ (or $\theta_2$) measurement degrades with small viewing angles. As is readily apparent from examination of equation (11), measuring the distance between the two most widely separated fiducials available in a single field of view (i.e., employing the greatest available value for $\Delta x_{fiducial}$) may maximize the accuracy of the $\theta_1$ and $\theta_2$ measurements. Additional accuracy may be afforded by averaging multiple measurements over any other widely spaced fiducials available in a particular field of view.

As with conventional metrology techniques, lighting may influence the overall operation of the system and method described herein. In that regard, it is noted that lighting techniques may affect the ability of an imaging device to extract detail (such as surface contours or texture, for example) from an imaged feature; further, lighting effects may also influence the geometric appearance of an imaged object or feature.

Accordingly, functionality and operational characteristics of one or more illumination sources, the imaging optics employed at imaging devices 110–112, or both, for example, may be selected either individually or in combination to produce a substantially uniformly illuminated image of the probe tip or other feature of interest on a particular test article. In that regard, it will be appreciated that an illumination source or system as well as an optical system comprising imaging devices 110 or 111,112 may each have a respective numerical aperture (NA) value. As NA values decrease, for example, the resulting images reveal more surface feature detail which may complicate the image processing task of ascertaining location through distance measurements. From this standpoint, various components of system 100 (such as the illumination source and devices 110–112, for example) may be constructed or selected such that the illumination system NA and the imaging or optical system NA are both large.

As set forth in detail above, the exemplary embodiments acquire image data from at least two different perspectives. In some applications, the lighting in each perspective may facilitate or allow preservation of the geometric properties of the object or feature being imaged. For example, if one image perspective employs lighting techniques tending to shift a feature's centroid to the left (the negative x direction, for instance) while the other perspective employs lighting techniques tending to shift a feature's centroid to the right (the positive x direction), the resulting impact on apparent distances to fiducials may produce erroneous location data.

One method of mitigating or eliminating the effects of a shift in image centroid due to perspective may comprise preserving the consistency of image geometry through implementation of a single, constant illumination source, i.e., generally "constant" in intensity and orientation. For example, in probe card testing applications designed to identify the location of the lowest point on the tip of a probe, the light from an illumination source may be oriented substantially vertically, i.e., parallel to the z axis in FIGS. 1B and 2B. In such a situation, by Lambert's principle, the horizontal surfaces that are characteristic of the lowest point on a probe may generate the greatest diffuse reflection intensity, and allow for correct identification of the lowest point on a probe. Probe tips, however, also produce specular reflections, which may reduce the effectiveness of this illumination strategy and produce apparent image shifts due to viewing angle.

Another approach to mitigating the effects of a perspective-induced shift in image centroid may comprise measuring the shift and accounting for it. For example, in a probe card analysis application, probe location measurements may be taken with and without overtravel; the measurements taken at the overtravel position generally correspond to the situation where the probes are in contact with the fiducials. In this overtravel situation, variations in probe to fiducial distance ($d_1$ and $d_2$) due to viewing angle should be minimal or eliminated entirely. Any measurable variation, therefore, may be attributed to the effect of a change in perceived geometry due to viewing angle. Any detected shift measured at the overtravel position may be used to correct measurements taken without overtravel.

In that regard, the probe to fiducial distances without overtravel (zero overtravel) may be represented as $d_{1ZOT}$ and $d_{2ZOT}$; similarly, the probe to fiducial distances with overtravel may be represented as $d_{1OT}$ and $d_{2OT}$.

At overtravel, an average of the two apparent probe to fiducial distances may generally produce a better estimate of the actual distance. Given the foregoing, the estimated error in feature geometry due to changing perspective may be computed by the following:

$$\hat{e}_d = \frac{d_{2OT} - d_{1OT}}{2}. \qquad (12)$$

An estimate of probe to fiducial distance in situations without overtravel may then be improved using the foregoing estimate.

$$d_{1ZOT} = d_{1ZOT} + \hat{e}_d \qquad (13)$$

$$d_{2ZOT} = d_{2ZOT} - \hat{e}_d. \qquad (14)$$

Substituting these perspective-corrected estimations of probe to fiducial distance for $d_1$ and $d_2$ in equations (1) and (2), may mitigate the effects of perspective-induced geometry variation on planarity and alignment measurements.

Several factors may impact the performance of the disclosed embodiments, including, for example: feature centroid identification accuracy; apparent distance measurement accuracy; fiducial location accuracy; optical depth of field (DOF); optical telecentricity; and the NA of the illumination system and imaging optics.

With respect to feature centroid identification accuracy, it is noted that accurately and repeatably identifying the centroid of a desired feature may influence results, as noted above. The surface geometry and optical reflective properties of the feature may vary considerably from one test specimen or article to another, and even within a given specimen. Acquired images of these features may be processed in such a way that the desired area may be correctly identified. In the case of a probe image for probe card analysis applications, for example, the desired area is typically the lowest point on the probe. Some methods which may have utility in identifying desired areas include connectivity (blob) analysis and pattern recognition.

With respect to apparent distance measurement accuracy, it is noted that the accuracy of feature location measurement is generally dependent upon the underlying accuracy of the device used to acquire images as set forth above with reference to equations (7) and (8) and FIG. 5. If images are captured using a CCD camera, for example, image quantization and noise may play an important role in the accuracy of apparent distance measurements. To maximize performance of such embodiments, image quantization size may be made as small (i.e., small pixels) as the particular application allows; additionally, it may be desirable to maximize image signal to noise. In that regard, filtering techniques may be implemented to mitigate the effects of noise. Pixel averaging or interpolation techniques may be employed to achieve sub-pixel accuracy.

With respect to fiducial location accuracy, it is noted that the exemplary embodiments generally measure the three positional components (i.e., coordinates in 3D space) of a feature of interest relative to a known fiducial location. Accordingly, inaccuracies in fiducial location may translate directly into inaccuracies in feature location. In applications employing a plurality or an array of fiducials, feature distance calculations with respect to multiple fiducials may be averaged, reducing reliance upon the location accuracy of a single fiducial.

With respect to optical DOF, it is noted that the disclosed embodiments image both a feature and a fiducial simultaneously; these elements are generally at different planarity or z distances from the image plane or lens, i.e., the distance from the image plane to the feature will likely be different than the distance from the image plane to the fiducial. Accordingly, one or both of the feature and the fiducial may not be in optimum focus. In particular, when viewing a fiducial and a feature that are laterally separated, the lateral separation combined with the viewing angle produce a depth variation between the objects. In some embodiments, therefore, the optical system (including imaging devices 110 or 111,112) employed to image the feature and the fiducial may be selected to have an adequate DOF to provide sufficient object location measurement accuracy in accordance with system requirements. It will be appreciated that attaining an appropriate DOF may require reducing the NA of the optics, which in turn reduces image resolution. As in any optical system, the competing goals of achieving a desired or selected DOF and maintaining a desired resolution may be balanced according to overall system requirements. In some implementations, the Scheimpflug Rule, for instance, or other optical concepts may be employed to minimize the required DOF.

With respect to optical telecentricity, it is noted that the fiducial and the feature are likely at different distances from the image plane, as noted above; it is generally desirable, however, that this depth separation not have a significant effect on image magnification. Since the measurement of apparent distance between a fiducial and a feature may generally be affected or influenced by magnification, any optical magnification may also affect the resulting position measurement of the feature. Normally, optical magnification varies with distance from an objective lens; the degree of such distance-dependence may be customized or selectively adjusted, for example. Telecentric optics, for instance, exhibit only a bounded variation in magnification as a function of distance. Accordingly, some embodiments may employ telecentric optics to acquire image data; the degree of telecentricity may be dictated by desired measurement accuracy and other system parameters.

Figure 6:
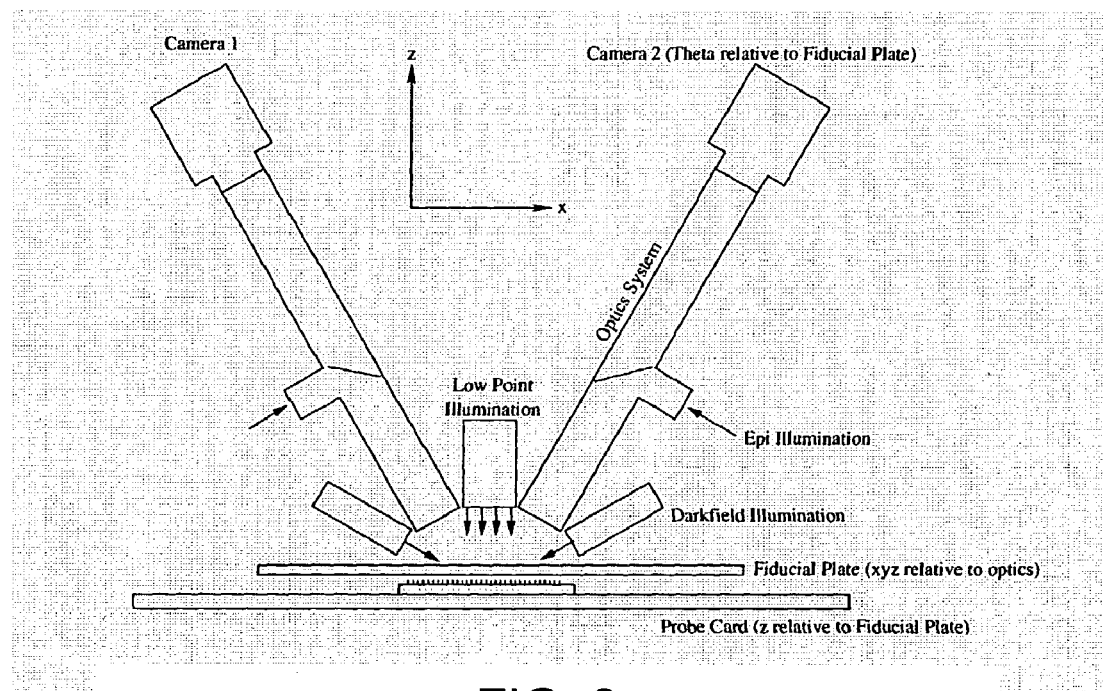
FIG. 6 is a simplified diagrammatical side view of one embodiment of a probe card analyzer system constructed and operative in accordance with the embodiment of FIGS. 1A and 1B.

As set forth above, aspects of the disclosed embodiments may be implemented in any general purpose 3D optical metrology application. By way of example, FIG. 6 is a simplified diagrammatical side view of one embodiment of a probe card analyzer system constructed and operative in accordance with the embodiment of FIGS. 1A and 1B. It will be appreciated that the embodiment of FIGS. 2A and 2B may also be appropriate for such a probe card analyzer.

As noted above, fiducial array configurations may comprise one or more fiducials suspended in or etched on a flat, substantially transparent fiducial plate fabricated of glass, quartz, or sapphire, for example. A suitable imaging array for use in conjunction with the FIG. 6 embodiment may be a roughly square area array CCD chip; alternatively, the array may be rectangular or other configurations generally known in the art.

Figure 7:
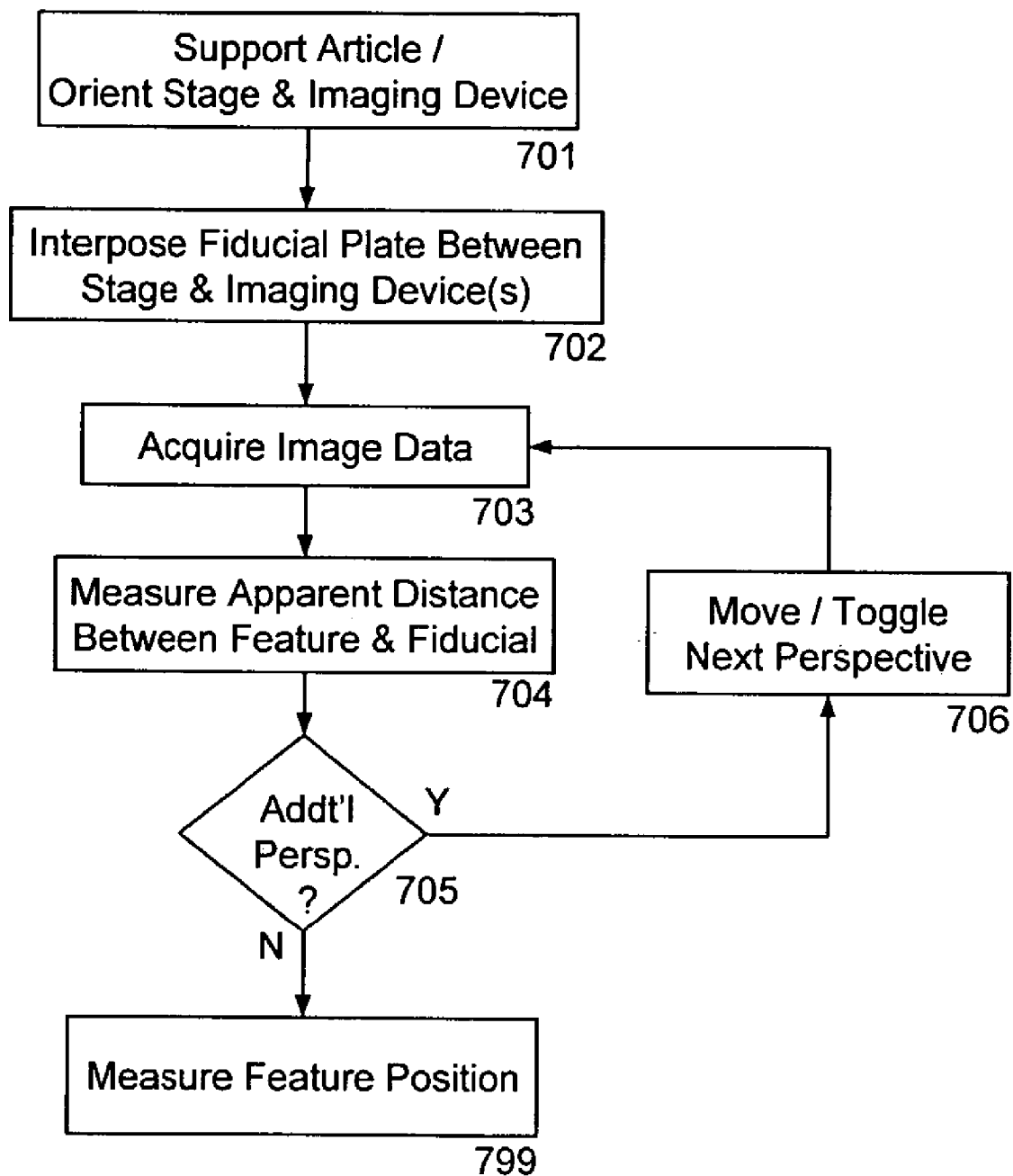
FIG. 7 is a simplified flow diagram illustrating the general operation of one embodiment of a stereoscopic three-dimensional metrology method.

FIG. 7 is a simplified flow diagram illustrating the general operation of one embodiment of a stereoscopic three-dimensional metrology method. The FIG. 7 method generally represents some or all of the functionality set forth in detail above; the exemplary operations may be executed or performed, in whole or in part, by various combinations of the system components illustrated and described above with reference to FIGS. 1–6.

As indicated at block 701, an article to be imaged (such as a semiconductor wafer, chip, or die, for instance) may be supported, attached, or otherwise disposed on a fixed or movable stage; the relative orientation of an imaging device and the stage, in general, and the article, in particular, may be selectively controlled or adjusted for optimal imaging. In that regard, the exemplary embodiments are susceptible of various modifications in which a selected relative orientation may be achieved through movement of any or all of the article, the stage, or the imaging device. The operation depicted at block 701 generally represents any of the positioning and orientation structures and techniques set forth above, irrespective of which system component is moved to achieve the relative orientation of the article and the imaging device.

A fiducial plate bearing a fiducial may be interposed between the article to be imaged and the imaging device as indicated at block 702. As set forth above, the fiducial plate may be substantially transparent, enabling the imaging device to image a feature on the article therethrough. In some embodiments, the fiducial plate may bear a plurality of fiducial markings, which may be arranged either arbitrarily, for instance, or in a predetermined or ordered array.

Image data may be acquired as indicated at block 703. In that regard, the substantial transparency of the fiducial plate generally allows or enables the imaging device to image both a feature of the test article and a fiducial on the fiducial plate simultaneously. In embodiments incorporating a fiducial plate bearing a plurality of fiducial markings, for example, the imaging device may image the feature of the test article and selected ones of the fiducial markings which are within the field of view of the optical system.

A method of measuring the location of the feature may generally measure an apparent distance between the feature and the fiducial from the acquired image data (block 704). While specific geometric aspects of the exemplary embodiments are set forth in detail above with particular reference to FIGS. 3 and 4, various other measurement techniques may be suitable for the operation depicted at block 704 and are accordingly contemplated herein. Apparent distance measurements may be influenced by system component geometry, for example, or other factors such as distance-dependent magnification effects, lighting or illumination strategies, error estimations and correction algorithms, and so forth. Where a fiducial plate bears a plurality of fiducials, the measuring operation at block 704 may comprise computing an apparent distance between the feature and selected ones of the plurality of fiducial markings.

As set forth in detail above, a system and method of stereoscopic 3D metrology may employ parallactic differences in apparent distances measured in images of the feature and one or more fiducials acquired from multiple perspectives. Accordingly, a determination may be made (decision block 705) whether additional perspective views are desired or required.

Where an additional image from a different perspective is desired as determined at decision block 705, one or more system components may be moved or reoriented relative to each other, or perspectives may be switched ("toggled") as indicated at block 706. In particular, the article, the stage, the imaging device, or some combination thereof may be moved such that the image plane of the imaging device may be moved from a first position to a second position relative to the article (i.e., changing perspectives). Additionally or alternatively, the image plane may be selectively rotated about one or more coordinate axes as set forth above. In the embodiment illustrated and described above with reference to FIGS. 1A–B and 3, for example, image perspective may be toggled between Image Plane 1 (imaging device 111) and Image Plane 2 (imaging device 112), each of which may be selectively oriented at a particular angle relative to the article to be imaged; additionally or alternatively, the stage and one or both of the imaging devices in such a two camera arrangement may be translated along a selected coordinate axis to shift perspectives as indicate at block 706. Subsequent image data may be obtained from the new perspective as control loops back to block 703.

Where an additional image from a different perspective is not desired as determined at decision block 705, the feature's position may be measured or computed as indicated at block 799. Such measurement or calculation may accurately locate a position of the feature relative to a specific fiducial or a fiducial array, the location of which may be known. Accordingly, accurate identification of the feature's position in 3D space relative to the fiducial enables accurate location of the feature relative to the article and other features thereof.

The FIG. 7 embodiment is presented for illustrative purposes only, and is not intended to imply an order of operations to the exclusion of other possibilities. By way of specific example, the operations depicted at blocks 701 and 702 may be reversed in order, for instance, or combined to occur substantially simultaneously; similarly, the operations depicted at blocks 703 and 704 may be executed concomitantly where data acquisition rate and image processing speed are sufficient. Additionally, it will be appreciated that embodiments employing multiple imaging devices may acquire multiple images from different perspectives simultaneously; parallel paths representing such simultaneous imaging operations have been omitted from FIG. 7 for clarity. Those of skill in the art will appreciate that the particular sequence in which the operations depicted in FIG. 7 are conducted may be influenced by, among other factors, the functionality and structural configuration of a particular imaging device or image processing component.

Figure 8:
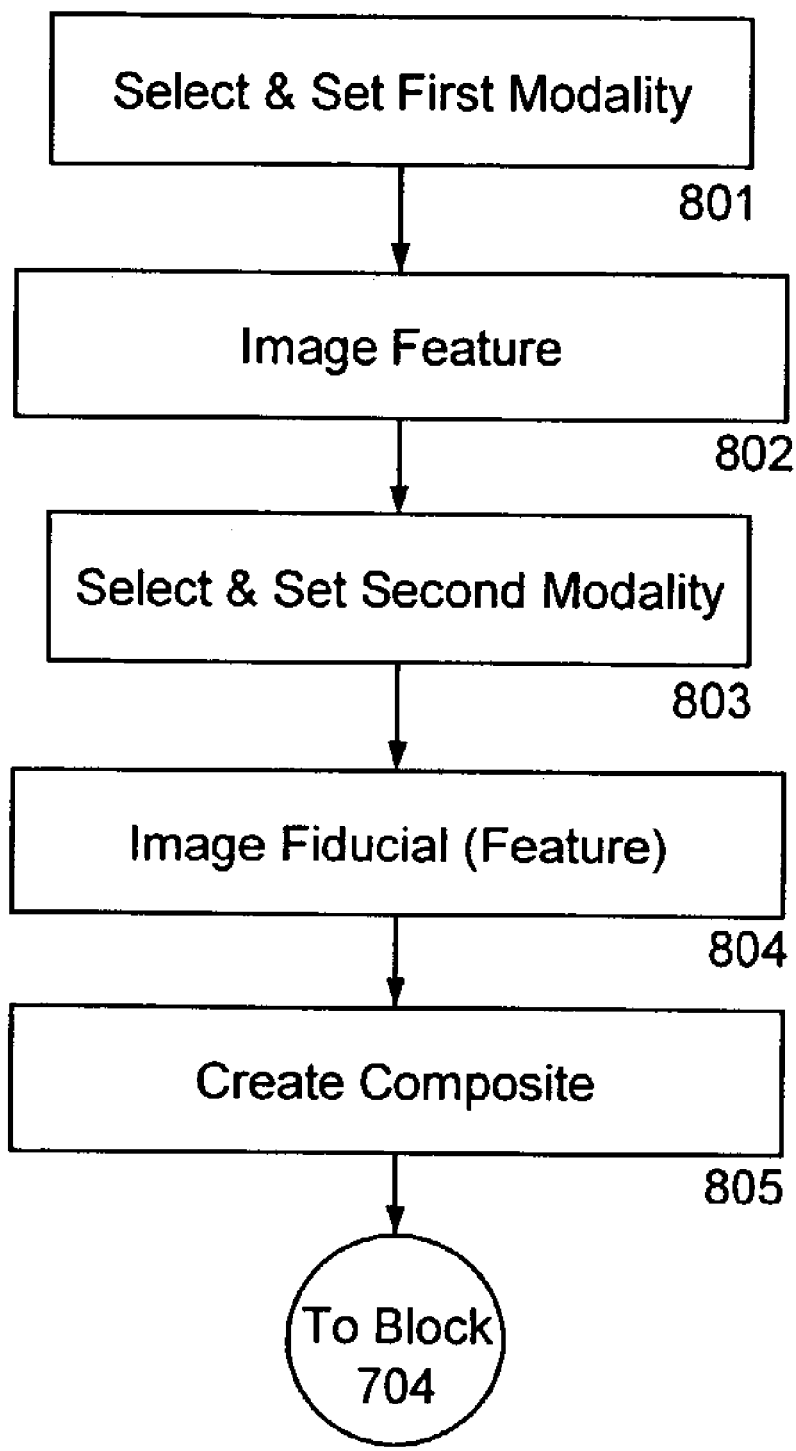
FIG. 8 is a simplified flow diagram illustrating the general operation of one embodiment of an image data acquisition operation.

FIG. 8 is a simplified flow diagram illustrating the general operation of one embodiment of an image data acquisition operation. Specifically, the operations depicted in FIG. 8 are directed to an image acquisition operation employing multiple imaging modalities. In is noted that the FIG. 8 embodiment generally represents the operations occurring at block 703 in FIG. 7.

A first imaging modality (e.g., color, wavelength, intensity of illumination or other factors) may be selected and set as indicated at block 801. A feature may be imaged from a particular perspective using the first modality as indicated at block 802. As set forth in detail above, the modality selected at block 801 may be configured to render a fiducial transparent during the imaging at block 802.

The imaging technique may be altered to employ a second modality as indicated at block 803. One or more fiducials may then be imaged at block 804; imaging operations at blocks 802 and 804 may be executed from the same perspective in 3D space., As indicated at block 804, the feature may also be imaged in the second modality. As an alternative to the order of progression depicted in FIG. 8, it will be appreciated that the operations executed at blocks 803 and 804 may precede acquisition of an image of the feature using the first modality at blocks 801 and 802.

Image data acquired during the two imaging operations at blocks 802 and 804 may be combined to provide a single composite image frame at block 805. Accordingly, an apparent distance between the fiducial and the feature may be obtained (such as by the operation depicted at block 703 in FIG. 7) as described above.

The present invention has been illustrated and described in detail with reference to particular embodiments by way of example only, and not by way of limitation. Those of skill in the art will appreciate that various modifications to the exemplary embodiments are within the scope and contemplation of the present disclosure. Accordingly, it is intended that the present invention be limited only by the scope of the appended claims.

What is claimed is:

1. A method of measuring a location of a physical feature on a test article; said method comprising:
    supporting a test article to be imaged;
    interposing a fiducial plate bearing a fiducial between said test article and an imaging device;
    imaging a feature of said test article and said fiducial, wherein said imaging includes acquiring image data representative of said feature and said fiducial from at least two perspectives;
    obtaining a plurality of distance measurements from said image data, said plurality of distance measurements including distance measurements representing apparent distance between said feature and said fiducial observed from one of said at least two perspectives; and
    calculating a location of said feature relative to said fiducial based on said plurality of distance measurements.

2. The method of claim 1 wherein said supporting comprises utilizing a stage movable along any of three coordinate axes.

3. The method of claim 2 wherein said stage is rotatable about any of said three axes.

4. The method of claim 3 wherein said imaging comprises selectively orienting said stage relative to said imaging device.

5. The method of claim 1 wherein said imaging comprises selectively orienting said imaging device relative to said stage to obtain a desired perspective.

6. The method of claim 1 wherein said imaging further comprises selectively translating an image plane of said imaging device relative to said test article to obtain a desired perspective.

7. The method of claim 6 wherein said selectively translating comprises moving said imaging device relative to said test article.

8. The method of claim 6 wherein said selectively translating comprises moving said test article relative to said imaging device.

9. The method of claim 1 wherein said said location of said feature is calculated in three-dimensional space.

10. The method of claim 1 wherein said acquiring comprises obtaining first image data on a first image plane oriented at a first angle relative to said article and obtaining second image data on a second image plane oriented at a second angle relative to said article.

11. The method of claim 10 wherein said first angle and said second angle are equal.

12. The method of claim 1 wherein said acquiring comprises:
    obtaining first image data when said imaging device is at a first location relative to said article;
    selectively adjusting the relative positions of said imaging device and said article; and
    obtaining second image data when said imaging device is at a second location relative to said article.

13. The method of claim 1 further comprising:
    selectively repeating said imaging, obtaining and calculating for one or more additional features on said test article; and
    calculating location of said feature relative to said one or more additional features.

14. The method of claim 11 wherein said fiducial plate bears a plurality of other fiducials and wherein said plurality of distance measurements comprises distance measurements representative of apparent distances between said feature and selected ones of said plurality of fiducials.

15. The method of claim 1 wherein relative position of said fiducial plate and said test article is fixed during said imaging.

16. The method of claim 1 wherein said calculating is further based on position of said imaging device relative to said fiducial plate for each of said at least two perspectives.

17. The method of claim 1 wherein relative position of said fiducial plate and said imaging device is fixed during said imaging.

18. The method of claim 1 wherein said calculating is further based on position of said imaging device relative to said fiducial plate for each of said at least two perspectives.

19. A metrology system comprising:
    a stage operative to support an article to be imaged;
    an imaging device selectively oriented relative to said stage and operative to acquire first image data from a first perspective relative to said article and second image data from a second perspective relative to said article;
    a fiducial plate, bearing a fiducial, interposed between said article to be imaged and said imaging device; and
    one or more image processors configured to calculate location of a feature on said article relative to said fiducial based on said first image data and said second image data, wherein
    said one or more processors calculate said location of said feature based on differences in measurements of apparent distance between said feature and said fiducial obtained from first and second image data.

20. The system of claim 19 wherein said imaging device is operative to image said fiducial and a feature on said article.

21. The system of claim 20 further comprising an image processing component operative to compute said apparent distances between said feature and said fiducial in each of said first and second image data.

22. The system of claim 19 wherein at least one of said stage and said imaging device is movable along any of three coordinate axes.

23. The system of claim 22 wherein at least one of said stage and said imaging device is rotatable about any of said three axes.

24. The system of claim 23 further comprising a control element operative selectively to control relative movement of said stage and said imaging device.

25. The system of claim 19 wherein said imaging device comprises a charge-coupled device image sensor.

26. The system of claim 19 wherein said imaging device comprises a complementary metal oxide semiconductor image sensor.

27. The system of claim 21 wherein said fiducial plate bears a plurality of fiducial markings.

28. The system of claim 27 wherein said image processing component is operative to compute apparent distances between said feature and selected ones of said plurality of fiducial markings.

29. The system of claim 19 wherein said location is calculated in three-dimensional space.

30. The system of claim 19 wherein said first image data are obtained when said image plane is oriented at a first angle relative to said article and said second image data are obtained when said image plane is oriented at a second angle relative to said article.

31. The system of claim 30 wherein said first angle and said second angle are equal.

32. The system of claim 19 wherein:
said first image data are acquired when said imaging device is at a first location relative to said article;
the relative positions of said imaging device and said article are selectively adjusted; and
said second image data are acquired when said imaging device is at a second location relative to said article.

33. The system of claim 19 wherein said article comprises a semiconductor wafer.

34. The method of claim 15 wherein said calculating is further based on position of said imaging device relative to said fiducial plate for each of said at least two perspectives.

35. The method of claim 17 wherein said calculating is further based on position of said test article relative to said fiducial plate for each of said at least two perspectives.

* * * * *